United States Patent
Kim et al.

(10) Patent No.: US 9,776,875 B2
(45) Date of Patent: Oct. 3, 2017

(54) METHOD OF MANUFACTURING GRAPHENE USING METAL CATALYST

(71) Applicant: SRC Corporation, Gyeonggi-do (KR)

(72) Inventors: Kang Hyung Kim, Gyeonggi-do (KR);
Kwan Sub Maeng, Geyonggi-do (KR);
Chol Woo Park, Gyeonggi-do (KR); Se Won Cha, Gyeonggi-do (KR); Se Youn Hong, Gyeonggi-do (KR); Byung He Hong, Gyeonggi-do (KR); Myung Hee Jung, Gyeonggi-do (KR); Kyung Eun Kim, Incheon (KR); Su Beom Park, Seoul (KR)

(73) Assignee: SRC Corporation (KR)

( * ) Notice: Subject to any disclaimer, the term of this patent is extended or adjusted under 35 U.S.C. 154(b) by 673 days.

(21) Appl. No.: 14/353,529

(22) PCT Filed: Oct. 18, 2012

(86) PCT No.: PCT/KR2012/008532
§ 371 (c)(1),
(2) Date: Apr. 23, 2014

(87) PCT Pub. No.: WO2013/062264
PCT Pub. Date: May 2, 2013

(65) Prior Publication Data
US 2014/0290565 A1    Oct. 2, 2014

(30) Foreign Application Priority Data

Oct. 24, 2011 (KR) .................. 10-2011-0108462
Dec. 2, 2011 (KR) .................. 10-2011-0128549
Apr. 17, 2012 (KR) .................. 10-2012-0039935

(51) Int. Cl.
*C01B 31/04* (2006.01)
*B01J 23/72* (2006.01)
(Continued)

(52) U.S. Cl.
CPC .......... *C01B 31/0461* (2013.01); *B01J 23/50* (2013.01); *B01J 23/52* (2013.01); *B01J 23/72* (2013.01);
(Continued)

(58) Field of Classification Search
CPC combination set(s) only.
See application file for complete search history.

(56) References Cited

U.S. PATENT DOCUMENTS 7,479,590 B1 * 1/2009 Kuczynski ............. B82Y 10/00
                                                   313/309
2003/0019755 A1 * 1/2003 Hey ........................ C25D 7/123
                                                   205/87
(Continued)

FOREIGN PATENT DOCUMENTS

KR         100116253       3/1997
KR        1020090103985   10/2009
(Continued)

OTHER PUBLICATIONS

Fan, Lili, et al., "Step driven competitive epitaxial and self-limited growth of graphene on copper surface", AIP Advances 1, (2011), 032145-1 to 032145-9. Dec. 31, 2011.
(Continued)

*Primary Examiner* — Duy Deo
*Assistant Examiner* — Erin Bergner
(74) *Attorney, Agent, or Firm* — McKee, Voorhees & Sease, PLC (57) ABSTRACT

The present invention relates to a method for producing graphene on a face-centered cubic metal catalyst having a plane oriented in one direction, and more particularly to a method of producing graphene on a metal catalyst having the (100) or (111) crystal structure and a method of producing graphene using a catalyst metal foil having a single (Continued)

orientation, obtained by electroplating a metal catalyst by a pulse wave current and annealing the metal catalyst. The invention also relates to a method of producing graphene using a metal catalyst, and more particularly to a method of producing graphene, comprising the steps of: alloying a metal catalyst with an alloying element; forming step structures on the metal catalyst substrate in an atmosphere of a gas having a molecular weight of carbon; and supplying hydrocarbon and hydrogen gases to the substrate. On unidirectionally oriented metal catalyst prepared according to the present invention, graphene can be grown uniformly and epitaxially. Moreover, a method for producing graphene according to the present invention can form monolayer graphene by epitaxially growing graphene while increasing the growth rate of graphene.

12 Claims, 6 Drawing Sheets

(51) Int. Cl.
| | | |
|---|---|---|
| C23C 16/26 | (2006.01) | |
| C23C 16/02 | (2006.01) | |
| B01J 37/18 | (2006.01) | |
| B01J 37/34 | (2006.01) | |
| B01J 23/50 | (2006.01) | |
| B01J 23/52 | (2006.01) | |
| B01J 23/89 | (2006.01) | |
| B01J 35/00 | (2006.01) | |
| B82Y 30/00 | (2011.01) | |
| B82Y 40/00 | (2011.01) | |

(52) U.S. Cl.
CPC ......... *B01J 23/8926* (2013.01); *B01J 35/002* (2013.01); *B01J 37/18* (2013.01); *B01J 37/348* (2013.01); *B82Y 30/00* (2013.01); *B82Y 40/00* (2013.01); *C01B 31/0453* (2013.01); *C23C 16/0218* (2013.01); *C23C 16/0281* (2013.01); *C23C 16/26* (2013.01)

(56) References Cited

U.S. PATENT DOCUMENTS

2011/0195207 A1* 8/2011 Hong ...................... C23C 16/26
 428/34.1
2011/0290380 A1* 12/2011 Okayama ................ B32B 15/01
 148/536

FOREIGN PATENT DOCUMENTS

| KR | 1020110006644 | | 1/2011 | |
|---|---|---|---|---|
| KR | 1020110051584 | | 5/2011 | |
| WO | 2010/055612 | * | 5/2010 | ............ B32B 15/00 |

OTHER PUBLICATIONS

Gao, Li, et al., "Epitaxial Graphene on Cu(111)", Nano Lett., 10, 3512-3216. Aug. 2, 2010.

* cited by examiner

METHOD OF MANUFACTURING GRAPHENE USING METAL CATALYST

CROSS-REFERENCE TO RELATED APPLICATIONS

This is a National Phase application claiming priority to PCT/KR2012/008532 filed Oct. 18, 2012 which claims priority to Korean Application 10-2012-0039935 filed Apr. 17, 2012, Korean Application 10-2011-0128549 filed Dec. 2, 2011, and Korean Application 10-2011-0108462 filed Oct. 24, 2011, all of which are herein incorporated by reference in their entireties.

TECHNICAL FIELD

The present invention relates to a method of producing graphene using a metal catalyst.

BACKGROUND ART

Graphene is attracting a great deal of attention because of its excellent properties. With respect to graphene, professors Geim and Novoselov at the University of Manchester first succeeded in separating atomic layers from graphite using scotch tape in the year 2004 and were awarded the Nobel Prize for their discovery of graphene in the year 2010. In the year 2010, a roll-to-roll transfer technique of manufacturing large-area graphene having an area of 30 inches was reported, and technologies enabling graphene to be industrially applied have been continuously developed. For industrial application, graphene is required to be formed uniformly as a single layer. In the prior art, the use of general copper foils suffers from a problem in that multilayer graphene is present as islands or an epitaxial graphene layer or epitaxial graphene layers do not easily grow.

In the manufacturing of graphene electrodes, the surface energy state of a metal catalyst is important for the epitaxial growth of monolayer graphene. This is because the atomic packing density of a metal varies depending on the orientation of the metal and because factors, including dislocation density, stacking fault energy, twins and impurities, which influence the surface energy of the catalyst, influence the reaction with the gaseous molecules or atoms to be adsorbed. Particularly, when a metal has low solubility or low reactivity with the element to be adsorbed, it barely acts as a catalyst. For example, copper is frequently used for the formation of graphene thin films and has a face-centered cubic (FCC) structure. However, the solid solubility of carbon which is adsorbed onto the surface of the catalyst copper in CVD processes at 1000° C. is 0.028 at % or less. Due to this low reactivity, it is very difficult to control the adsorption of carbon atoms during the CVD processes. If structures having different orientations are present together, the energy state will become non-uniform, and thus the adsorption rate of carbon will differ between areas. This problem results in the growth of multilayer graphene in some areas to form graphite. Thus, to uniformly grow carbon on copper to form graphene thin films, it is effective to use as a catalyst a substrate which has a uniform energy state and at the same time, has formed thereon nucleation sites on which graphene nets are to be formed. Materials capable of satisfying a uniform energy state include single crystalline materials. Many studies thereon have been conducted, and particularly, studies on the use of single crystalline hexagonal FCC metals oriented in the (111) or (100) direction (for example, the study of Hori) or on single crystalline HCP metals having a (0001) plane have been conducted (J. Phys. Chem. B., Vol. 106, No. 1 15-17, 2002, Y. Hori et al.).

However, the results of the studies did not lead to industrialization, because only single crystalline metals having a size of several tens of nm can be prepared and it is impossible to obtain large areas which are industrially applicable. In addition, for industrial application, graphene is required to be formed uniformly as single layers, but the use of general copper foils in the prior art suffers from a problem in that multilayer graphene is present as islands, because the epitaxial growth rate of graphene is low.

The present inventors have developed a method for preparing a unidirectionally oriented metal catalyst for uniformly and epitaxially growing graphene and have found that the orientation and surface energy state of a catalyst substrate, particularly step structures, have a great influence on the adsorption of carbon atoms and the growth of graphene, thereby completing the present invention.

SUMMARY OF INVENTION

Technical Problem

It is an object of the present invention to make the energy of a metal catalyst substrate uniform and make the surface of the catalyst substrate having unidirectionally oriented structures in order to uniformly and epitaxially grow graphene. Another object of the present invention is to provide a method for producing graphene, comprising the steps of: alloying a metal catalyst substrate to form fine step structures on the surface of the catalyst; forming step structures on the alloyed metal catalyst substrate in the atmosphere of hydrogen gas and a gas having a molecular weight higher than the atomic weight of carbon; and supplying hydrocarbon and hydrogen gases to the metal catalyst substrate.

Technical Solution

To achieve the above objects, one embodiment of the present invention provides a method of producing graphene by forming step structures on the surface of a face-centered cubic metal catalyst substrate having the (100) or (111) orientation and supplying hydrocarbon to the substrate.

In the present invention, the metal catalyst may be a face-centered cubic metal catalyst having a cold rolling reduction ratio of 85% or higher and the (100) or (111) orientation. The metal catalyst may have a thickness of 50 µm or less. The metal catalyst may be recrystallization-annealed in a hydrogen or reducing atmosphere, cooled and then heated in an atmosphere of methane and hydrogen to grow graphene thereon. The metal catalyst may be any one selected from the group consisting of copper, silver and gold. 95% or more of the graphene is a monolayer graphene thin film. The metal catalyst may be electroplated by a pulse wave current, and the step structure may be formed by annealing at a temperature of 600° C. to 1070° C. The pulse wave current may be applied at a ratio of current supply time: rest time of 15:85 to 85:15. The pulse wave current may have a current density of 1-10 A/dm$^2$, and the metal catalyst may be a face-centered cubic metal foil obtained by plating a metal on a cathode rotating drum. The cathode rotating drum may be polished to a roughness (Ra) of Ra 0.35 µm or less.

In addition, the metal catalyst may be alloyed with an alloying element, and the alloying element may be any one or more selected from among period 2 to period 6 elements among group 3 to group 12 transition metal elements and group 13 to 15 elements. The step structures on the metal catalyst may be formed in the atmosphere of a gas having a molecular weight higher than the atomic weight of carbon, and the metal catalyst may be aluminum, nickel, austenitic stainless steel, silver, gold or copper. The alloying element may be any one or more transition elements which have solid solubility for hydrogen or form carbides at a temperature ranging from 600 to 1060° C., and the alloying element may be any one or more selected from among aluminum, indium, silicon, silicon, germanium, tin, antimony and bismuth. The gas having a molecular weight higher than the atomic weight of carbon may be any one or more selected from among neon, argon, krypton, nitrogen, hydrocarbon, carbon dioxide, carbon monoxide and steam ($H_2O$).

In the present invention, when viewing the surface energy of copper according to the crystalline structure, the (111) plane has the highest packing density and stable energy level among three simple planes, and the (100) plane is the next stable plane. In addition, in an actual measurement process, the (100) plane is also expressed as (200) and (001) depending on the measurement direction and position, but these can all be regarded as the same orientation.

In the present invention, the (110) plane has an open structure between two parallel arrangements of atoms, and thus is unstable compared to the (111) or (100) plane and has a structure on which a graphene net is difficult to form. For this reason, it is not suitable to use the (110) plane as a catalyst for forming a graphene mono layer.

As used herein the term "electrodeposited copper foil" refers to a copper thin film made by an electroplating process, but is limited thereto. In the present invention, the electrodeposited copper foil is prepared by carrying out electrolysis in electrolyte solution bath and electrodepositing and/or electroplate the copper ion of the plating solution onto the drum surface. Examples of the electrodeposited copper foil include a general electrodeposited copper foil having a shiny side, which is smoothly deposited on the drum surface, and a matte side opposite thereto, and a plated copper foil obtained by depositing a copper thin film on a copper foil by the electroplating process.

One embodiment of the present invention is directed to a method of making a copper foil. This method is carried out using a foil making system comprising: a container to which electrolyte solution containing copper ions is continuously supplied; a drum, a part of which is dipped and rotated in the electrolyte solution and to which a negative terminal is connected; and an anode spaced apart from the dipped part of the drum and also placed in the electrolyte solution. In this copper foil making system, an electric current is applied between the cathode rotating drum and the anode to continuously electrodeposit copper ions on the drum surface.

In one embodiment of the present invention, if the roughness (Ra) of the drum surface is more than 0.35 µm, it will be transferred to the electrodeposited copper foil so that graphene will be non-uniformly and excessively produced as multilayered area in a CVD process.

In one embodiment of the present invention, if the thickness of an oxide layer on the drum surface is less than 1 nm, the separating force of an electrodeposited copper will increase provably to damage the copper foil, and if the thickness of the oxide layer is more than 20 nm, electrolysis current density will be excessively required, resulting in decreased productivity.

In one embodiment of the present invention, the drum is made of titanium or stainless steel, which is generally used for the fabrication of electrodeposited copper foils. In addition, it may be made of carbon steel, alloy steel, non-ferrous metals, ceramic materials or composite materials. In addition, any material may be used for the drum, as long as it can coat cubic structure metal by means such as deposition, plating or spraying.

In another embodiment of the present invention, a plated copper foil is provided by pulse-current plating copper and controlling the foil to a single orientation by annealing. Also, a rolled copper foil is provided by cold-rolling a copper foil at a reduction ratio of 85% or more and controlling the foil to a single orientation by annealing. On these copper foils, graphene is easily grown.

In one embodiment of the present invention, there is provided graphene fabricated by the above method.

Figure 1:
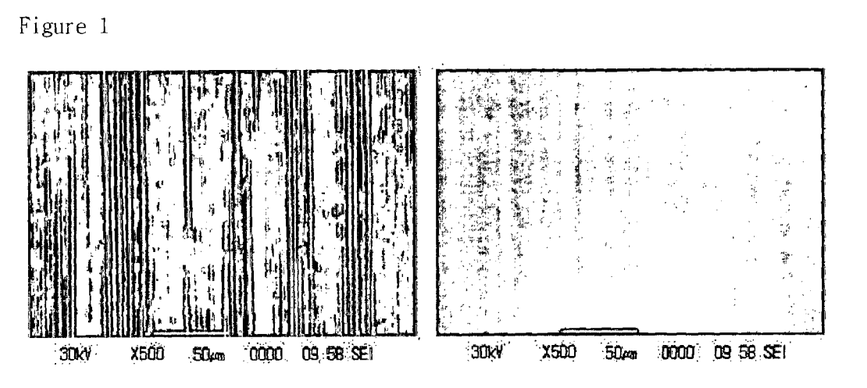
FIG. 1 is a set of SEM photographs showing the rolled state of a copper foil and the state of the copper foil after recrystallization annealing.
Figure 5:
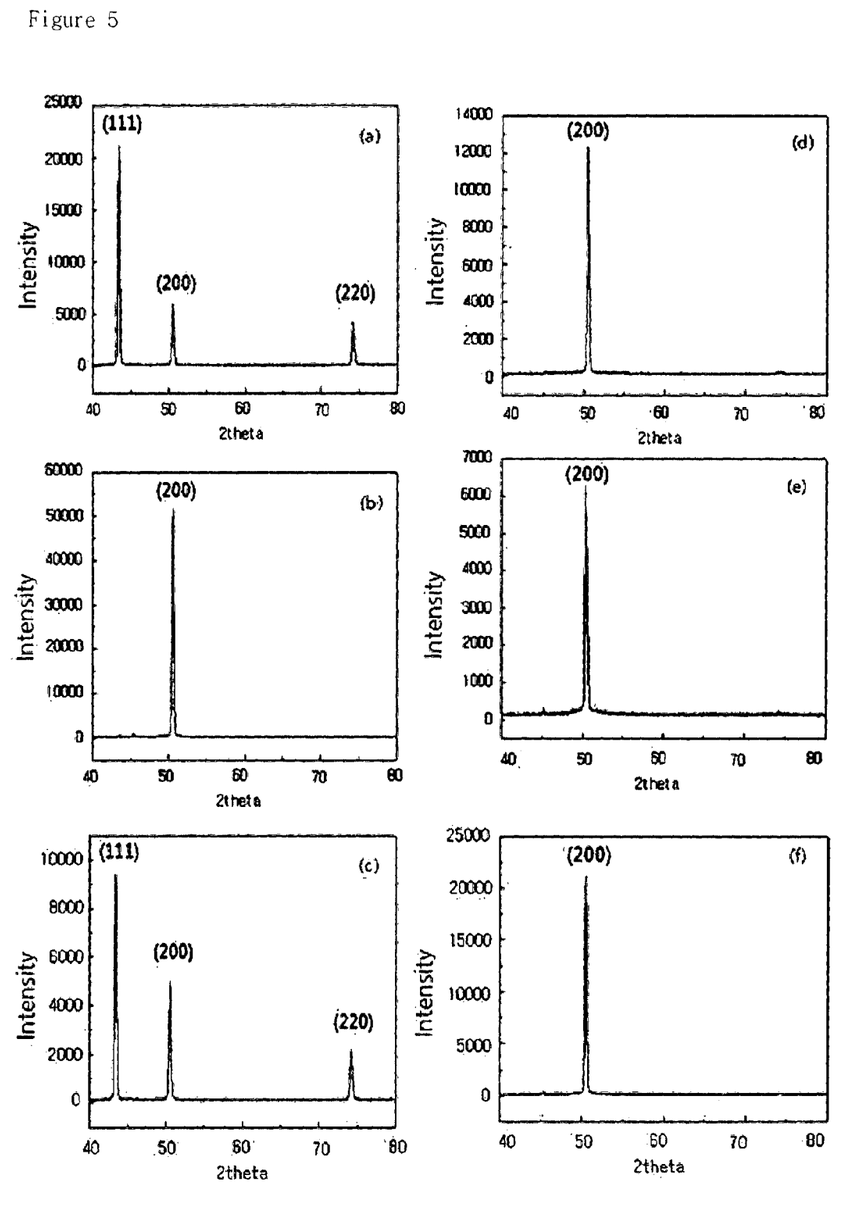
FIG. 5 shows the pulse copper plating state of pulse copper plated specimens and the results of measuring the orientation of the specimens by XRD after growing graphene thereon.

In the present invention, the catalyst substrate preferably has a hexagonal lattice structure having a single orientation so that uniform and epitaxial graphene is grown thereon. Importantly, the surface of the catalyst substrate is smooth when viewed macroscopically and has a step structure when viewed microscopically. The catalyst substrate preferably has the (111) and/or (100) orientation. As shown in FIGS. 3(b) and 5, the step types of the present invention are developed fine step from a nano unit to a micron unit. Four types of step were mainly found by the present inventors (FIG. 1). The step types include paddy-field steps, ledges, ratchet steps, and multi-cube steps. The step structures were developed when supplying a gas having a mass higher than the atomic weight of carbon (12) while annealing a foil, cold-rolled at a high reduction ratio, at a temperature of 600° C. or higher.

Figure 8:
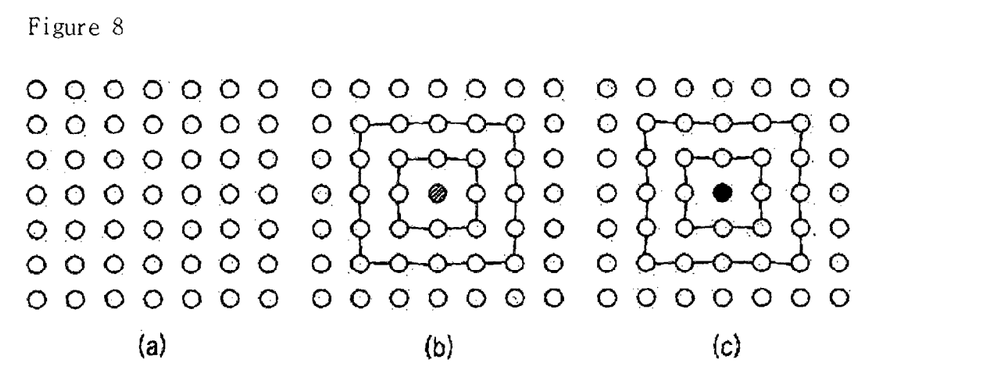
FIG. 8 is a set of schematic diagrams showing the arrangement of copper atoms and the state of carbon alloyed with a substitutional element.
Figure 11:
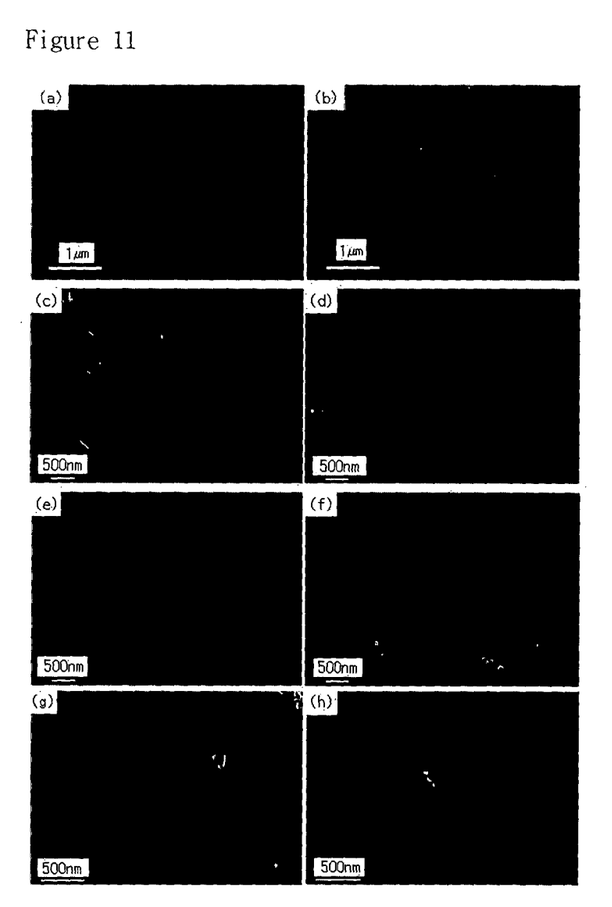
FIG. 11 shows the results of synthesizing graphene using copper and various copper alloy catalysts by CVD.

FIG. 8 shows the atomic arrangement of coppers alone and the state of a copper alloy containing a substitutional element. FIG. 8(a) shows the atomic arrangement of coppers, and FIGS. 8(b) and 8(c) show the atomic arrangements of copper alloys which contain a substitutional element having an atomic diameter larger than that of copper and a substitutional element having an atomic diameter smaller than that of copper, respectively. If there is a difference in the atomic radius as shown in FIGS. 8(b) and 8(c), lattice distortion (lattice strain) is present around the substitutional element and results in energy imbalance. The connection line between the atoms around the substitutional element shows this lattice distortion. This lattice distortion in a copper alloy promotes the production of dislocation in a process during which the alloy undergoes physical external stress, such as a rolling process. When a thin sheet having a large amount of this stacking fault or dislocation is annealed at high temperature in an atmosphere of a gas having a molecular weight higher than the atomic weight of carbon, atoms on the surface will move to form steps as shown in FIG. 11. Because the step structures act as nucleation sites, they adsorb hydrocarbon to produce carbon radicals assembling as graphene nuclei. Once graphene nuclei are produced, radicals around the nuclei bind to the surrounding radicals or directly adsorb hydrocarbon to form carbon-carbon bonds, thereby growing graphene.

In one embodiment of the present invention, if the stacking fault energy of the catalyst substrate is reduced or lattice distortion increases by alloy element addition, dislocations or twins are likely to occur in the material to increase the internal energy. Thus, alloying is carried out such that step structures are easily formed during annealing. Unlike this, in metals having high stacking fault energy, dislocations attract each other and cross-slip easily occurs so as to reduce the dislocation density and thus reduce the internal energy of the material. Thus, in the present invention, when an alloying element is added to reduce the stacking fault energy, twins are likely to occur during annealing at high temperature. The twin sites have higher surface energy so that graphene growth becomes easy, and thus larger graphene crystals can be obtained. The alloying element is an element which has hydrogen solid solubility or forms carbides at a temperature of 600~1060° C. at which graphene can be synthesized. Specifically, it is selected from among period 2 to period 6 elements among group 3 to 12 transition elements and group 13, 14 and 15 elements. The hydrogen solid solubility of elements at 1000° C. is 70.5 ppm for copper, 4.5 ppm for gold, 22.4 ppm for silver, 2.6 ppm for chromium, 1.2 ppm for molybdenum, 32.8 ppm for manganese, 186.2 ppm for cobalt, 251 ppm for iron, 562.3 ppm for nickel, 7079 ppm for rhodium, 4.7 ppm for platinum, 11879 ppm for titanium, and 85.1 ppm for aluminum. This suggests that transition metals have solid solubility for hydrogen In the case of elements other than transition metals, aluminum of group 13 has high solid solubility, and indium binds with hydrogen at high temperature to form a compound. Among group 14 and 15 elements, silicon makes carbides, and germanium, tin, antimony and bismuth form hydrogen compounds, like indium. Thus, the alloying elements described in the present invention may mostly be added.

In one embodiment of the present invention, as the reduction ratio of a copper foil increases and the thickness of a copper foil decreases, dislocations increase, and the rotation of recrystallized grains in an annealing process can be facilitated. It was found that 95% or more of the area of a copper foil which was cold-rolled at a reduction ratio of 85% or more had the (100) orientation after annealing. Thus, in order to obtain a structure having a single orientation, a copper foil can be rolled at a reduction ratio of 85% or higher to a thickness of 50 μm or less.

Copper has low stacking fault energy, and thus when it is cold-rolled, the dislocation density thereof is increased to cause atomic migration and diffusion during annealing. Herein, the atoms migrate by an image force acting between dislocations during heating at high temperature and finally disappear while leaving step structures corresponding to Burgers vectors on the surface. As the stacking fault energy and flow stress of the catalyst copper alloy decrease and the cold reduction ratio thereof increases, dislocation movement in the material becomes more active to facilitate the formation of step structures. The step structures which are formed in atomic layer units in the Burgers vector size by this dislocation movement are formed so small even at a high temperature of 1000° C. such that they so weakly adsorb gas molecules. For this reason, in the present invention, a gas, such as argon or nitrogen, which has a molecular weight higher than the atomic weight of carbon while having low chemical reactivity with a copper foil, is supplied together with small amount of hydrogen during an annealing process, so that the gas molecules collide with the copper surface by the Brown motion even at a temperature of about 600° C. to assist in the migration of copper atoms, thereby facilitating the formation of step structures. Unlike areas in which impurity elements or alloying elements exist as compounds, step structures are distributed uniformly throughout the catalyst surface, and thus form an environment in which graphene grows epitaxially.

In one embodiment of the present invention, hydrogen serves to maintain the reducing atmosphere, and thus it is added in an amount corresponding to less than 40% of the flow rate of the gas after draw-air out for an annealing chamber. In the graphene synthesis process following the annealing process, hydrogen also serves to control the growth rate of graphene, because the decomposition rate of hydrocarbon decreases as the ratio of hydrogen increases. The flow rate of the gas is in the range of 0.1-10 sccm/μm, and it can be increased as the thickness of a copper foil increases, and it is decreased with increases in temperature and the molecular weight of the gas.

The step structures act as nucleation sites, and thus adsorb hydrocarbons to produce carbon radicals serving as graphene nuclei. Once graphene nuclei are produced, carbon radicals around the nuclei bind to the surrounding carbon radicals or directly adsorb hydrocarbon to form carbon-carbon bonds, thereby growing graphene.

Advantageous Effects

On a unidirectionally oriented metal catalyst prepared according to the present invention, graphene can be grown uniformly and epitaxially.

Moreover, a method for producing graphene according to the present invention can form monolayer graphene by epitaxially growing graphene while increasing the growth rate of graphene.

MODE FOR INVENTION

Hereinafter, the present invention will be described in detail with reference to examples and test examples. It is to be understood, however, that these examples are for illustrative purposes and are not intended to limit the scope of the present invention.

EXAMPLES

Example 1

Fabrication of Graphene Thin Film on Rolled Copper Foil

Tough pitch copper foils (a purity of 99.9% or more, an oxygen content of 0.05% or less) having thicknesses of 0.5 mm and 0.2 mm were annealed, and then cold-rolled to thicknesses of 12 µm, 25 µm, 40 µm, 50 µm and 100 µm. The cold-rolled foils were heated at various annealing temperatures so that 95% or more thereof was oriented in the (100) direction. It was confirmed that a graphene thin film was evenly formed on the annealed foils (see FIG. 1). After recrystallization, only crystal growth occurred on the foils, and thus the orientation of the foils did not change to a new orientation. Table 1 below shows the results of forming graphene layer at various reduction ratios under various heat treatment conditions.

TABLE 1

|  | Thickness of raw material (mm) | Thickness after rolling (µm) | Reduction ratio (%) | (100) plane orientation | Recrystallization annealing temperature (° C.) | Formation of monolayer graphene |
|---|---|---|---|---|---|---|
| Preparation Example 1 | 0.2 | 12 | 94 | ◯ | 200 | ◯ |
| Preparation Example 2 | 0.2 | 25 | 87.5 | ◯ | 600 | ◯ |
| Comparative Example 3 | 0.2 | 40 | 80 | X | 1000 | X |
| Comparative Example 4 | 0.2 | 50 | 75 | X | 1000 | X |
| Preparation Example 5 | 0.5 | 40 | 92 | ◯ | 600 | ◯ |
| Preparation Example 6 | 0.5 | 50 | 90 | ◯ | 800 | ◯ |
| Comparative Example 7 | 0.5 | 100 | 80 | X | 1000 | X |

As can be seen in Table 1 above, when the foils were cold-rolled at a reduction ratio of 85% or more, 95% or more the area thereof was oriented in the (100) direction, and when the foils were recrystallization-annealed, graphene layer could be formed on the copper foils. Also, it can be seen that, when the reduction ratio is high and the thickness of the copper foil is small, the (100) orientation is easily formed. Thus, the rolled copper foil provided according to the present invention has a critical significance when it has a reduction ratio of 85% or more or a thickness of 50 µm or less.

Figure 2:
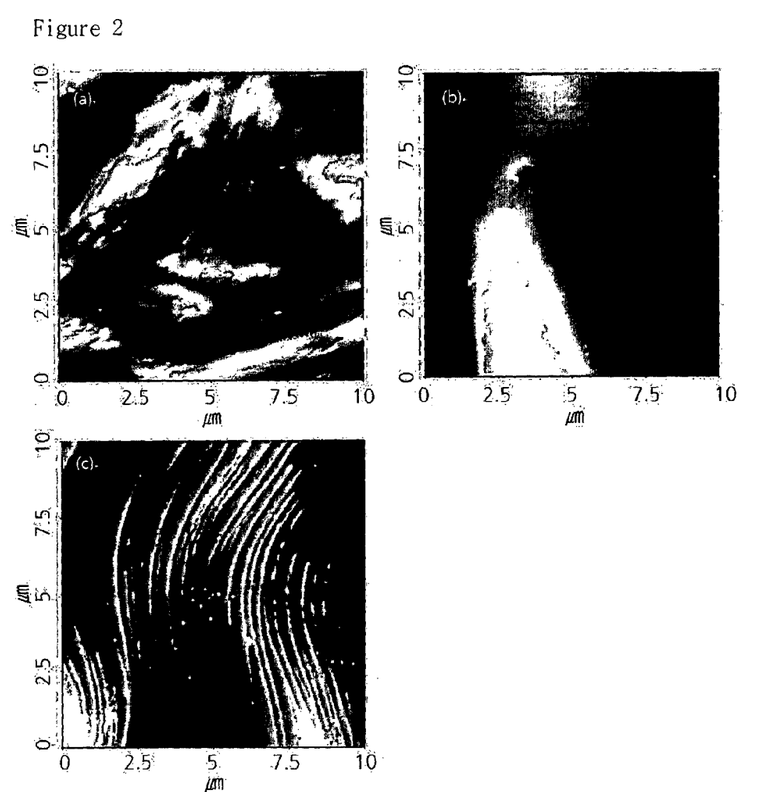
FIG. 2(a) shows the state of a copper foil according to the present invention.
FIG. 2(b) shows the copper foil annealed at 1000° C. in the hydrogen atmosphere.
FIG. 2(c) shows graphene grown by supplying methane together with hydrogen to the copper foil.

The foils were recrystallization-annealed at various temperatures in an atmosphere of hydrogen having a flow rate of 10 sccm, followed by cooling, and the orientation thereof was measured. Then, the foils were heated to 1000° C. and maintained in an atmosphere of 15 sccm methane and 10 sccm hydrogen for 30 minutes while graphene was grown thereon by CVD. FIG. 2(a) shows the state of a copper foil according to the present invention, FIG. 2(b) shows the copper foil annealed at 1000° C. in a hydrogen atmosphere, and FIG. 2(c) shows graphene grown by supplying methane together with hydrogen to the copper foil. In the present invention, it was found that, even when copper foils are heated at high temperatures, the development of steps thereon differ between an annealing process in which only hydrogen is supplied and an annealing process a mixed gas of methane gas and hydrogen is supplied.

Figure 3:
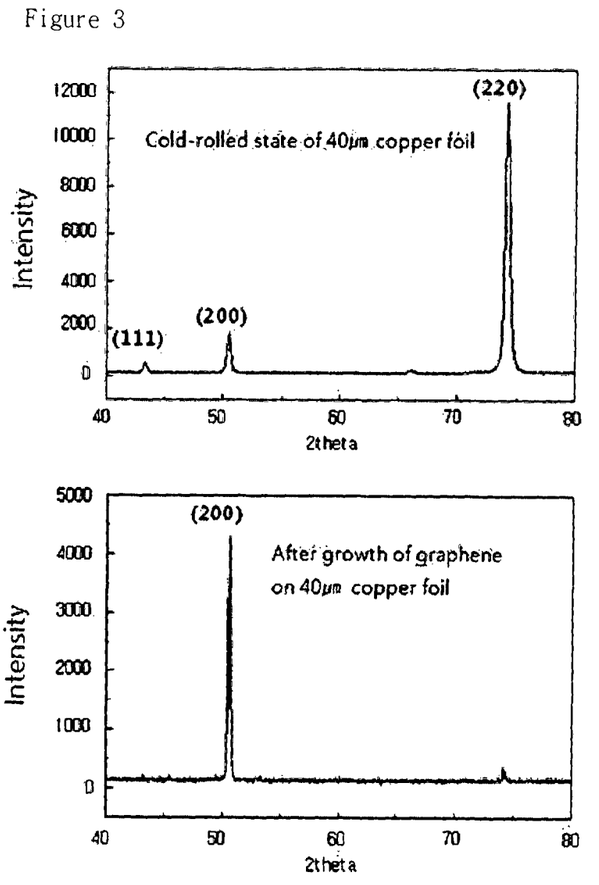
FIG. 3 is a set of graphs showing the rolled state of a copper foil and the results of measuring the orientation of the foil by XRD after growing graphene thereon.
Figure 4:
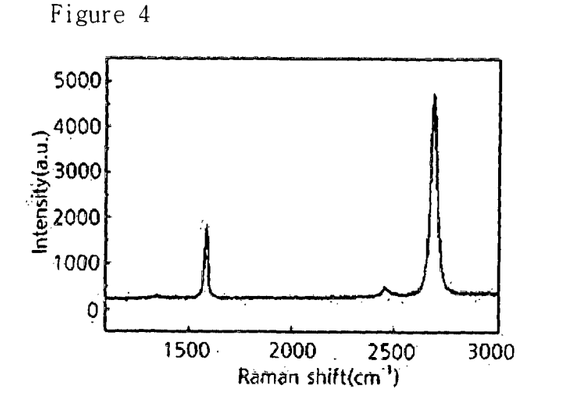
FIG. 4 is a graphic diagram showing the results of measurement of the Raman spectrum of monolayer graphene.

FIG. 3 shows the state of the rolled foil in Preparation Example 5 and the orientation of the foil measured after forming graphene thereon. FIG. 4 shows the results of measuring the Raman spectrum of the foil after growing graphene thereon. As can be seen therein, monolayer graphene was formed on the foil.

Example 2

Fabrication of Graphene Layer on Electrodeposited Copper Plated Tough Pitch Copper Foil 2-1: Fabrication of Electrodeposited Copper Foil by Pulse-Current Plating and Graphene Layer Plain tough pitch copper foils were air-stirred in a solution composed of 180-330 g/L of copper sulfate pentahydride ($CuSO_4 \cdot 5H_2O$), 40-120 g/L of sulfuric acid and 40-120 ppm of hydrochloric acid at a temperature of 30~55° C. and a current density of 1-10 A/dm², thereby pulse current plating the foils. The results are shown in FIG. 5, and the pulse waveform is expressed as current supply time: rest time.

FIGS. 5(a) and 5(b) show the results of measuring the state of a specimen obtained by plating copper on a copper foil at a ratio of 80:20 at a current density of 4.2-4.3 A/dm² and the orientation of a structure obtained by growing graphene on the specimen at 1000° C.; FIGS. 5(c) and 5(d) show the results of measuring the state of a specimen obtained by plating copper on a copper foil at a ratio of 50:50 at a current density of 2.6 A/dm² and the orientation of a structure obtained by growing graphene on the specimen at 1000° C.; and FIGS. 5(e) and 5(f) show the results of measuring the state of a specimen obtained by plating copper on a copper foil at a ratio of 20:80 at a current density of 1.6 A/dm² and the orientation of a structure obtained by growing graphene on the specimen at 1000° C.

As can be seen therein, in the plated state, the (200) single orientation or a mixed orientation of (111) (200) (220) orientations can appear depending on the plating conditions, but after the growth of graphene at 1000° C., only the (200) orientation appears. Also, when the pulse current plated specimens were annealed, the mixed orientation was arranged to the (200) orientation at 600° C. or higher regardless of the plating conditions. However, even at the above current density range, the mixed orientation appeared even after annealing, when plating was carried out by a PR (pulse-reverse) method or direct current plating.

It appears that the reason why the single orientation is determined depending on the waveform of current even at the same current density is that the pulse wave shows a high atomic packing density compared to other current waves while providing epitaxial electrodeposition, and thus the mixed orientation is arranged to a single orientation by subsequent heating. With respect to another reason, in the manufacturing of general electrodeposited copper foils, plating is carried out at high current density and a high rate of about of 1 m/min, and thus the degree of disorder of deposited copper atoms is high such that the orientation thereof is difficult to rearrange to a single orientation by the introduction of heat energy during annealing.

Thus, the scope of the present invention includes pulse-plating a copper foil by stirring in a solution composed of 180-330 g/L of copper sulfate pentahydride ($CuSO_4.5H_2O$), 40-120 g/L of sulfuric acid and 40-120 ppm of hydrochloric acid at a temperature of 30~55° C. and a current density of 1-10 A/dm$^2$, and annealing the pulse-current plated copper foil at a temperature of 600° C. or higher, and also growing graphene on the plated copper foil.

2-2: Fabrication of Electrodeposited Copper Foil and Graphene Layer

Copper scrap was dissolved in acid solution, and the solution was supplied into an opening below an anode placed in an electrolysis bath containing 250 g/l of copper sulfate ($CuSO_4.H_2O$) and 80 g/l of sulfuric acid at 30° C., while an electrolysis reaction (cathode electrode current density: 8 A/dm$^2$) was induced so that a thin copper foil having a (111) orientation was electrodeposited on a titanium (Ti) rotating drum having a connector to cathode. Herein, the foil side facing the drum side was shiny, and the opposite side was matte. The drum surface was polished to a roughness (Ra) of 0-0.35 μm and anodized to form an oxide layer of 1-20 nm in order to facilitate the separation of an electrodeposited copper foil from the polished drum surface.

Figure 6:
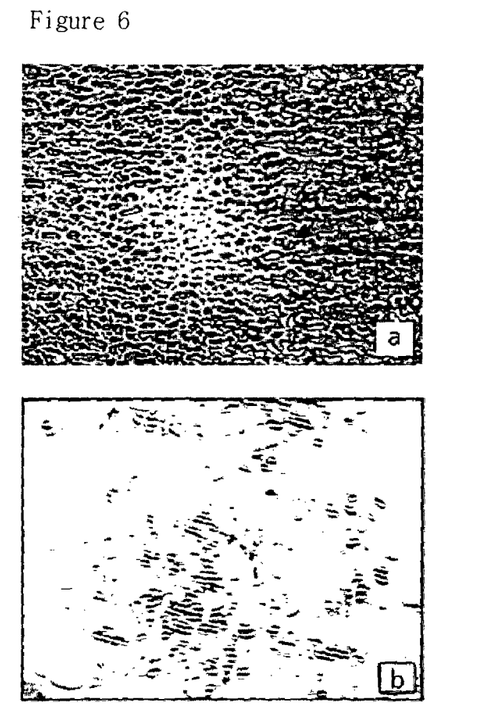
FIG. 6 is a set of optical micrographs showing graphene grown on an electrodeposited copper foil in one direction (CVD, 1050° C. for 10 min; upper: 100× magnification; lower: 1000× magnification).
Figure 7:
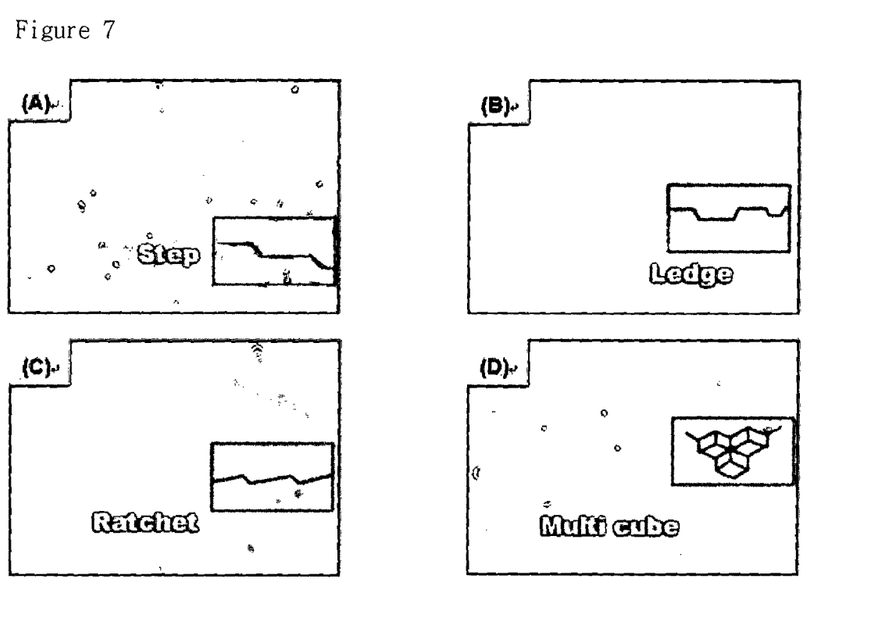
FIG. 7 shows various steps formed when annealing a metal thin sheet in a gas atmosphere.

Copper was pulse-current plated on the electrodeposited copper foil according to the method of Example 2-1, and graphene was deposited and grown thereon by CVD. The resulting structure was observed with an optical microscope and the orientation thereof was measured by XRD (see FIGS. 5 and 6). As a result, it could be seen that the electrodeposited copper foil after annealing had an unidirectional orientation having the (111) or (200) orientation and that epitaxial graphene was formed on the electrodeposited copper foil produced using the drum having a surface roughness (Ra) of 0.0001-0.35 μm.

Example 3

Formation of Graphene on Copper Alloy Catalyst Substrate

Figure 9:
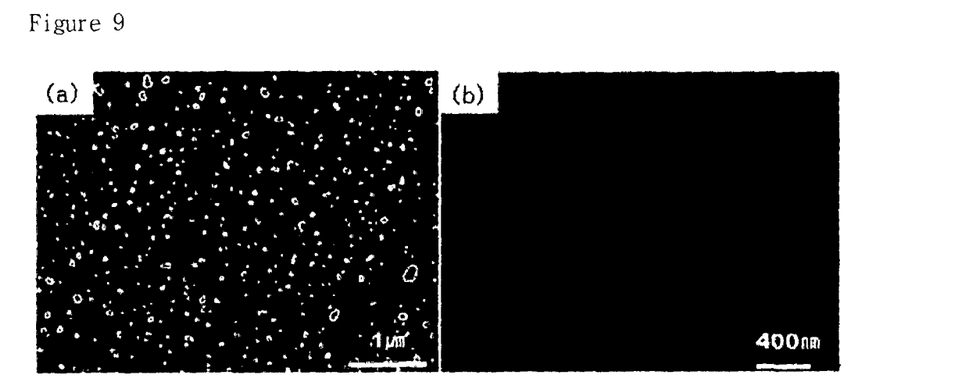
FIG. 9 shows the results of synthesizing graphene using copper and a copper alloy at 600° C. for 30 minutes.

A copper alloy foil containing 140 ppm of silver (see FIG. 9(*b*)) was heated at 600° C. for 30 minutes in an atmosphere of 70 sccm methane and 10 sccm hydrogen, and whether graphene was formed on the alloy foil was examined. As a control, copper (see FIG. 9(*a*)) was treated under the same conditions, and whether graphene was formed thereon was examined (see FIG. 9).

It can be seen that, when graphene was formed on copper, graphene islands and carbides were formed, but on the silver-containing copper alloy, graphene was epitaxially formed. However, when copper was previously annealed at 800° C. to form steps, graphene was epitaxially formed thereon.

The above copper alloy and copper had a hexagonal lattice structures having the (111) or (100) orientation after annealing, and these catalyst substrates also had the same orientation in the following examples.

Thus, it could be seen that the addition of a substitutional alloy to copper provides graphene nucleation sites and promotes the development of a step structure to suppress carbide formation and also enables the epitaxial growth of graphene.

Example 4

Examination of Effect of Formation of Step Structure

Figure 10:
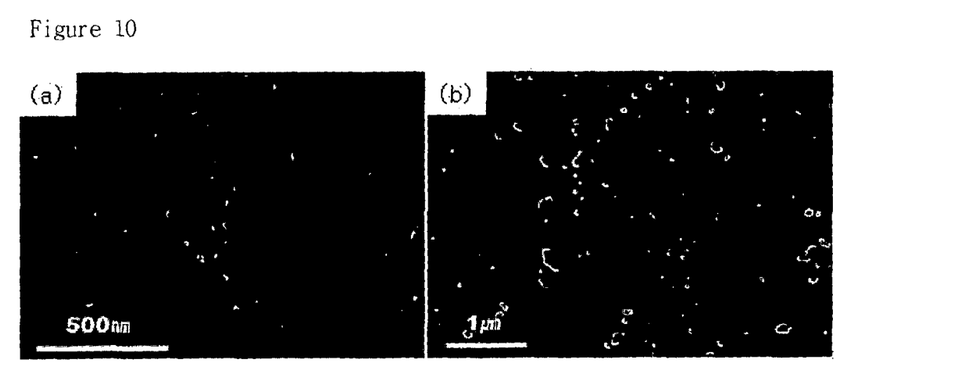
FIG. 10 shows the results of synthesizing graphene using copper and a copper alloy by CVD at 800° C. for 30 minutes.

A 18 μm thick copper alloy foil containing 3.2% nickel, 1.5% silicon and 0.4% magnesium was annealed at 1000° C. for 30 minutes in an atmosphere of a mixed gas of 50 sccm argon and 10 sccm hydrogen to form steps structure, and graphene was synthesized thereon by CVD at 800° C. for 30 minutes in an atmosphere of a mixed gas of 70 sccm methane and 10 sccm hydrogen (see FIG. 10(*a*)).

As a control, a 25-μm thick copper foil containing no alloy element was annealed at 1000° C. for 30 minutes in an atmosphere of a mixed gas of 50 sccm argon and 10 sccm hydrogen to form a step structure, and graphene was synthesized thereon by CVD at 800° C. for 30 minutes in an atmosphere of a mixed gas of 70 sccm methane and 10 sccm hydrogen (see FIG. 10(*b*)).

As can be seen in FIG. 10(*a*), diamond particles were grown on multilayer graphene on the copper alloy foil, and as can be seen in FIG. 10(*b*), multilayer graphene and diamond particles were grown together on the copper foil. It could be seen that carbon radicals were rapidly produced on the copper alloy foil even at 800° C. lower than 1000-1060° C. at which graphene is conventionally synthesized by CVD. Also, it could be seen that, when a step structure is formed on a copper foil, graphene is grown thereon even at low temperature.

Thus, when a step structure is sufficiently developed, graphene can be synthesized by reducing the concentration of hydrogen gas or shortening the synthesis time.

As can be seen in FIG. 10(*a*), when the amount of the alloy is excessive, monolayer graphene can be obtained by reducing the alloy amount to atom % or less or reducing the concentration of hydrocarbon and the synthesis time. As can be seen in FIG. 10(*b*), when the concentration of hydrocarbon gas is excessively high, the production of carbon radicals is faster than the growth of graphene, and thus graphene grows at the nucleation sites while triangular or rectangular plate-like carbon or wire- or particle-like carbon grows. Even in this case, monolayer graphene could be obtained by reducing the concentration of hydrocarbon or increasing the concentration of hydrogen gas during the synthesis of graphene. From this phenomenon, the present inventors could find that the formation of step structures promotes the production of carbon radicals and the growth rate of graphene, thus greatly contributing to forming monolayer graphene.

Example 5

Examination of Growth of Graphene on Catalyst Substrate Containing Various Alloying Elements As a control for the graphene prepared in Example 4, copper foil was annealed at 1000° C. for 30 minutes in an atmosphere of a mixed gas of 50 sccm argon and 10 sccm hydrogen, and graphene was synthesized thereon by CVD at 1000° C. for 30 minutes in an atmosphere of a mixed gas of 15 sccm methane and 10 sccm hydrogen. The results are shown in FIG. 11(a).

Meanwhile, FIG. 11(b) shows the results obtained by annealing a copper alloy foil containing 80 ppm of silver at 800° C. for 30 minutes in an atmosphere of a mixed gas of argon 20 sccm and 10 sccm hydrogen and then synthesizing graphene thereon by CVD at 1000° C. for 5 minutes in an atmosphere of a mixed gas of 20 sccm methane and 10 sccm hydrogen. FIG. 11(c) shows the results obtained by annealing a copper alloy foil containing 40 ppm of chromium at 1000° C. for 30 minutes in atmosphere of a mixed gas of 50 sccm argon and 10 sccm hydrogen and then synthesizing graphene thereon by CVD at 800° C. for 3 minutes in an atmosphere of a mixed gas of 20 sccm methane and 10 sccm hydrogen; FIG. 11(d) shows the results obtained using a copper alloy foil containing 200 ppm of iron under the conditions as the case of FIG. 11(c); FIG. 11(e) shows the results obtained using a copper alloy foil containing 130 ppm of cobalt under the conditions as the case of FIG. 11(c); FIG. 11(f) shows the results obtained using a copper alloy foil containing 100 ppm of nickel under the conditions as in the case of FIG. 11(c); FIG. 11(g) shows the results obtained using a copper alloy foil containing 140 ppm of silver under the conditions as the case of FIG. 11(c); and FIG. 11(h) shows the results obtained using a copper alloy foil containing 70 ppm of silicon under the conditions as the case of FIG. 11(c). As can be seen therein, the step structures were well developed and graphene was epitaxially grown. Herein, the dark areas in the graphene are separated parts to the catalyst surface, or grain boundaries or twins, which absorbed or irregularly reflected electrons because the step structures below the graphene layer changed.

Figure 12:
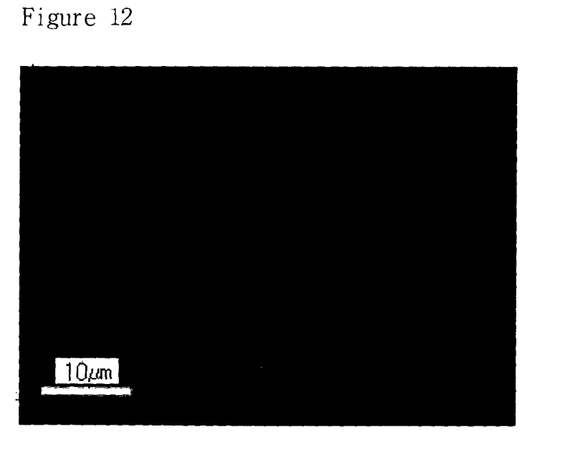
FIG. 12 shows the results of synthesizing graphene by CVD at 1000° C. for 1 second in an atmosphere of a mixed gas of 30 sccm methane and 10 sccm hydrogen.

In addition, it was found that, even when CVD synthesis was carried out at 1000° C. for 1 second in an atmosphere of a mixed gas of 30 sccm methane and 10 sccm hydrogen, well developed step structures and formed graphene nuclei (see FIG. 12).

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiments disclosed for carrying out this invention, but that the invention will include all embodiments falling within the scope of the present application.

The invention claimed is:

1. A method of producing graphene, the method comprising:
    forming step structures on the surface of a face-centered cubic metal catalyst substrate having a (100) or (111) orientation; and
    supplying hydrocarbon to the substrate to grow graphene comprising a monolayer graphene thin film thereon,
    wherein the metal catalyst is allowed with an alloying element and has a cold rolling reduction ratio of 85% or higher.

2. The method of claim 1, wherein the metal catalyst has a thickness of 50 μm or less.

3. The method of claim 1, wherein the metal catalyst is recrystallization-annealed in a hydrogen or reducing atmosphere, and then heated in an atmosphere of methane and hydrogen to grow graphene thereon.

4. The method of claim 1, wherein the metal catalyst is any one selected from the group consisting of copper, silver, gold, and alloys thereof.

5. The method of claim 1, wherein the monolayer graphene thin film 95% or more of the graphene.

6. The method of claim 1, wherein the step structures are formed by annealing at a temperature of 600° C. to 1070° C.

7. The method of claim 1, wherein the alloying element is any one or more selected from among period 2 to period 6 elements among group 3 to group 12 transition metal elements and group 13 to 15 elements.

8. The method of claim 7, wherein the step structures on the metal catalyst are formed in an atmosphere of a gas having a molecular weight higher than the atomic weight of carbon.

9. The method of claim 7, wherein the metal catalyst is aluminum, nickel, austenitic stainless steel, silver, gold or copper.

10. The method of claim 7, wherein the alloying element is any one or more of transition elements which have solid solubility for hydrogen or form carbides at a temperature ranging from 600 to 1060° C.

11. The method of claim 7, wherein the alloying element is any one or more selected from among aluminum, indium, silicon, germanium, tin, antimony and bismuth.

12. The method of claim 8, wherein the gas having a molecular weight higher than the atomic weight of carbon is any one or more selected from among neon, argon, krypton, nitrogen, hydrocarbon, carbon dioxide, carbon monoxide and steam (H2O).

* * * * *